US009007541B2

(12) United States Patent
Chen et al.

(10) Patent No.: US 9,007,541 B2
(45) Date of Patent: Apr. 14, 2015

(54) PIXEL ARRAY AND DISPLAY PANEL

(75) Inventors: Szu-Chieh Chen, Miaoli County (TW);
Yu-Hsin Ting, Kaohsiung (TW);
Chen-Ming Chen, Taichung (TW);
I-Fang Chen, Hsinchu County (TW);
Yi-Xuan Hung, New Taipei (TW);
Da-Wei Fan, Taoyuan County (TW)

(73) Assignee: Au Optronics Corporation, Hsinchu (TW)

(*) Notice: Subject to any disclaimer, the term of this patent is extended or adjusted under 35 U.S.C. 154(b) by 46 days.

(21) Appl. No.: 13/615,598

(22) Filed: Sep. 14, 2012

(65) Prior Publication Data

US 2013/0256706 A1  Oct. 3, 2013

(30) Foreign Application Priority Data

Mar. 30, 2012  (TW) .............................. 101111419 A

(51) Int. Cl.
*G02F 1/1362*  (2006.01)
(52) U.S. Cl.
CPC ...... *G02F 1/13624* (2013.01); *G02F 1/136286* (2013.01); *G02F 1/136213* (2013.01)
(58) Field of Classification Search
CPC ............ G02F 1/13624; G02F 1/36286; G02F 1/36213
USPC .................. 257/49–75, 79–103; 345/76–107; 349/56–166
See application file for complete search history.

(56) References Cited

U.S. PATENT DOCUMENTS

| 5,191,451 | A * | 3/1993 | Katayama et al. ............... 349/48 |
| 7,777,851 | B2 * | 8/2010 | Lee et al. ...................... 349/139 |
| 7,791,679 | B2 * | 9/2010 | Elliott et al. ..................... 349/42 |
| 8,223,286 | B2 | 7/2012 | Liu et al. |
| 8,289,460 | B2 | 10/2012 | Tsai et al. |
| 2009/0190082 | A1 * | 7/2009 | Lee et al. ...................... 349/147 |
| 2010/0321602 | A1 * | 12/2010 | Liu et al. ......................... 349/42 |
| 2011/0149184 | A1 | 6/2011 | Tsai et al. |
| 2013/0105803 | A1 * | 5/2013 | Song et al. ...................... 257/59 |

FOREIGN PATENT DOCUMENTS

| TW | 200628943 | 8/2006 |
| TW | 201122682 | 7/2011 |
| TW | 201122691 | 7/2011 |
| WO | 2010127515 | 11/2010 |

OTHER PUBLICATIONS

"Office Action of China Counterpart Application", issued on Apr. 22, 2014, p. 1-8, in which the listed foreign reference (Ref. 1) was cited.
"Office Action of Taiwan Counterpart Application", issued on Jun. 11, 2014, p. 1-6, in which the listed foreign references(Ref. 2-3) were cited.

* cited by examiner

*Primary Examiner* — Steven J Fulk
*Assistant Examiner* — Eric Ward
(74) *Attorney, Agent, or Firm* — Jianq Chyun IP Office

(57) ABSTRACT

A pixel array and a display panel are provided. The pixel array includes a plurality of pixel units. Each of the pixel units includes a first scan line, a second scan line, a data line, a first thin-film transistor, a second thin-film transistor, a first pixel electrode and a second pixel electrode. The first thin-film transistor is electrically connected to the first scan line and the data line. The first pixel electrode is electrically connected to the first thin-film transistor. The second thin-film transistor is electrically connected to the second scan line and the data line. The second pixel electrode is electrically connected to the second thin-film transistor. The orthogonal projection pattern of the first thin-film transistor on XY plane and the orthogonal projection pattern of the second thin-film transistor on XY plane are substantially the same.

17 Claims, 4 Drawing Sheets

PIXEL ARRAY AND DISPLAY PANEL

CROSS-REFERENCE TO RELATED APPLICATION

This application claims the priority benefit of Taiwan application serial no. 101111419, filed on Mar. 30, 2012. The entirety of the above-mentioned patent application is hereby incorporated by reference herein and made a part of this specification.

BACKGROUND OF THE INVENTION

1. Field of the Invention

The invention relates to a pixel structure and more particularly to a pixel array having a half source driving (HSD) structure.

2. Description of Related Art

With the development of large display panel nowadays, the so called half source driving (HSD) structure is widely used for a pixel array structure of liquid crystal display. Since the number of data lines may be reduced to half by using the HSD pixel structure, the price of the source driver is reduced accordingly. More specifically, the HSD structure includes a plurality of pixel units, each of the pixel units includes two neighbouring sub-pixels which share one data line, thereby reducing the number of data lines to half.

Generally, each of the sub-pixels includes a thin-film transistor, a capacitor and a pixel electrode. The thin-film transistor includes a gate electrode, a channel layer, a source electrode and a drain electrode. The gate electrode is electrically connected to the scan line, the source electrode is electrically connected to the data line, and the drain electrode is electrically connected to the pixel electrode. The capacitor is used to storage capacitance. When the thin-film transistor is turned off after charging to each of the sub-pixels is completed, the voltage level of the pixel electrode in each of the sub-pixels may easily changed by nearby voltage variation, and the amount of such voltage variation is known as feed-through voltage. Generally, feed-through voltage is affected by the gate/drain parasitic capacitance and the storage capacitance in each of the sub-pixels.

The patterns of the thin-film transistors in the HSD pixel structure is normally designed symmetrically in mirror. For example, the orthogonal projection patterns of two thin-film transistors sharing the data line on XY plane are upside-down patterns which are symmetrical in mirror. However, as the development of display panel follows the trend of becoming larger in size, when an exposing process is performed using a photomask for manufacturing a large display panel, since overall accuracy of large photomask is difficult to control due to factors like thermal expansion and cold shrinkage, overlapping alignment error (or overlay variation) in each metal layer of the thin-film transistor may easily become larger. Accordingly, overlapping areas between the metal layer, the channel layer and the gate electrode of the thin-film transistors in the neighbouring sub-pixels may be different, such that the gate/drain parasitic capacitances of the thin-film transistors of the neighbouring sub-pixels are different, therefore, feed-through voltages thereof may also be different. As a result, the display quality of the display panel may be affected thereby.

SUMMARY OF THE INVENTION

A pixel array and a display panel for providing better display quality are provided.

The invention provides a pixel array, including a plurality of pixel units. Each of the pixel units includes a first scan line, a second scan line, a data line, a first thin-film transistor, a first pixel electrode, a second thin-film transistor and a second pixel electrode. The first thin-film transistor is electrically connected to the first scan line and the data line. The first pixel electrode is electrically connected to the first thin-film transistor. The second pixel electrode is electrically connected to the second scan line and the data line. The second pixel electrode is electrically connected to the second thin-film transistor. An orthogonal projection pattern of the first thin-film transistor on a XY plane and an orthogonal projection pattern of the second thin-film transistor on the XY plane are substantially the same.

The invention provides a display panel, including a first substrate, a second substrate and a display medium. The first substrate has said pixel array. The second substrate is located at the opposite side of the first substrate. The display medium is located between the first substrate and the second substrate.

Base on the above, the orthogonal projection patterns of the first thin-film transistor and the second thin-film transistor on the XY plane are substantially the same. Accordingly, since the overlay shifts of the first thin-film transistor and the second thin-film transistor are the same, the variations of gate/drain parasitic capacitance in the first thin-film transistor and the second thin-film transistor may be the same if overlay shift occurs during manufacturing process of the pixel array. As a result, feed-through voltages of the neighboring sub-pixels in the same pixel unit may remain the same, thereby allowing the display panel to have a better display quality.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
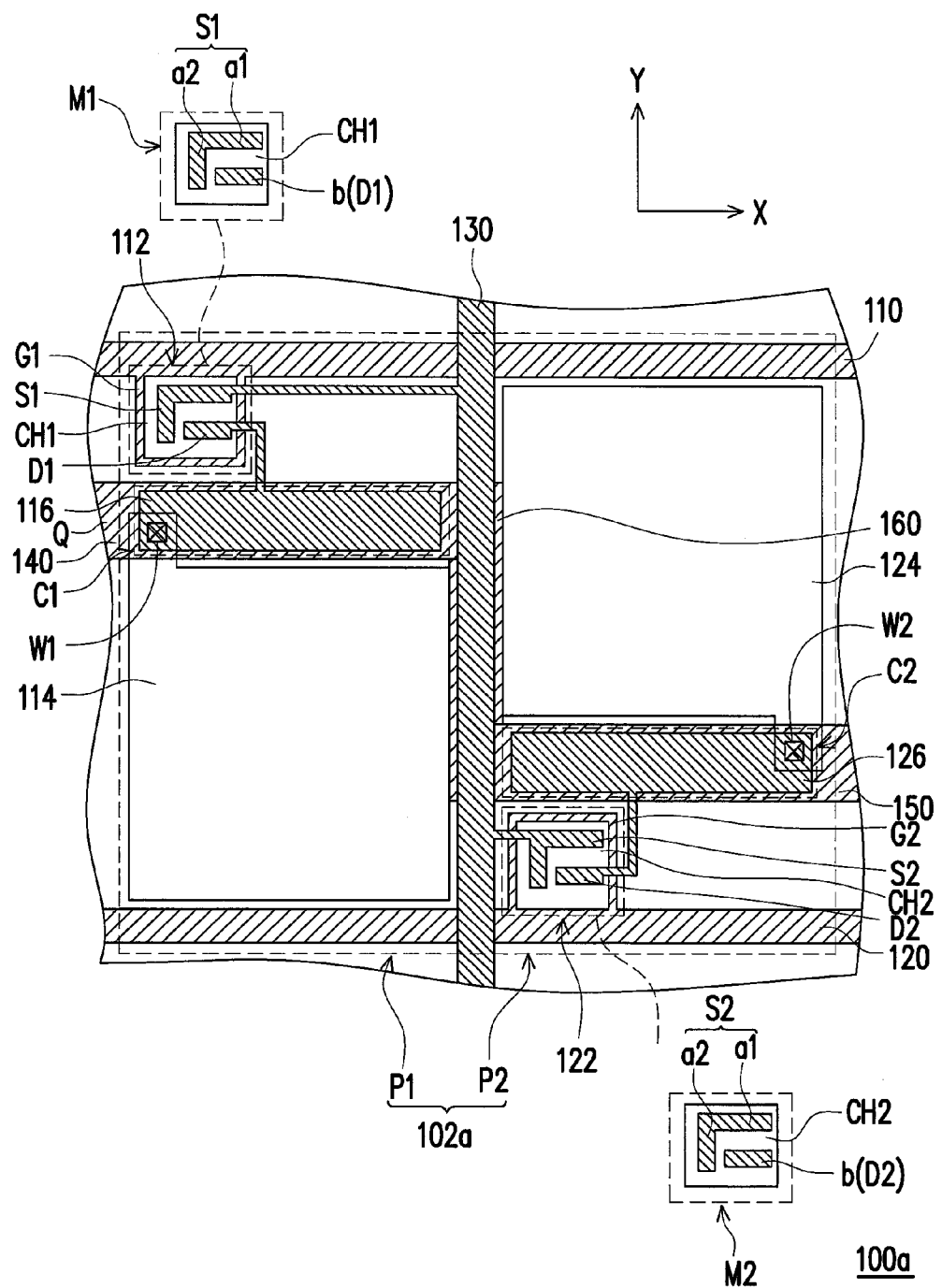
FIG. 1 is a partial view of a pixel array according to a first embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Pixel Array

First Embodiment

FIG. 1 is a partial view of a pixel array according to the first embodiment of the invention. Referring to FIG. 1, the pixel array 100a of the present embodiment includes a plurality of pixel units 102a. Herein, although FIG. 1 illustrates only one pixel unit 102a, however, those skilled in the art may understand the structure of the pixel array 100a of the invention, by the structure shown in FIG. 1 and the following description.

The pixel unit 102a includes a first sub-pixel P1 and a second sub-pixel P2, wherein the first sub-pixel P1 includes a first scan line 110, a data line 130, a first thin-film transistor 112, and a first pixel electrode 114. The second sub-pixel P2 includes a second scan line 120, the data line 130, a second thin-film transistor 122 and a second pixel electrode 124. According to the present embodiment, the first sub-pixel P1 and the second sub-pixel P2 share the data line 130, thereby forming a HSD pixel structure.

The material of the first scan line 110, the second scan line 120 and the data line 130 may be metal material, alloy, nitride of metal material, oxide of metal material, nitrogen oxide of metal material or laminated layer of metal materials and other conductive materials. The material of the first scan line 110, the second scan line 120 and the data line 130 may be the same or different. The first scan line 110 is used to control the first sub-pixel P1, and the second scan line 120 is used to control the second sub-pixel P2.

The first thin-film transistor 112 is electrically connected to the first scan line 110 and the data line 130. The first thin-film transistor 112 includes a first gate electrode G1, a first channel CH1, a first source electrode S1 and a first drain electrode D1, wherein the first gate electrode G1 is electrically connected to the first scan line 110, the first source electrode S1 is electrically connected to the data line 130. According to the present embodiment, the first thin-film transistor 112 has an orthogonal projection pattern on a XY plane, as shown in the enlarged diagram of part M1 in FIG. 1. It is noted that, definition of said orthogonal projection pattern includes a pattern of the first source electrode S1, a pattern of the first drain electrode D1, layout between the first source electrode S1 and the first drain electrode D1, and a pattern of the first channel CH1. Further, definition of the said orthogonal projection pattern does not include the pattern and layout design of the connecting wire between the first source electrode S1 and the data line 130, and the pattern and layout design of the connecting wire between the first drain electrode D1 and other components.

In the present embodiment, the first source electrode S1, for example, is connected by two conductor portions which are perpendicular to each other, wherein one conductor portion a1, for example, is an elongated conductor extended towards X direction, and another conductor portion a2, for example, is an elongated conductor extended towards Y direction. Moreover, the first drain electrode D1, for example, is composed by one conductor portion b, wherein the conductor portion b, for example, is an elongated conductor extended towards X direction. Specifically, the first drain electrode D1 is located within a right angular space defined by the first source electrode S1, and a right angular shape gap is located between the first drain electrode D1 and the first source electrode S1.

The first pixel electrode 114 is electrically connected to the first thin-film transistor 112. Specifically, the first pixel electrode 114, for example, is electrically connected to the first drain electrode D1 through a contact window W1, and the first pixel electrode 114, for example, is driven by the first thin-film transistor 112.

The second thin-film transistor 122 is electrically connected to the second scan line 120 and the data line 130. The second thin-film transistor 122 includes a second gate electrode G2, a second channel CH2, a second source electrode S2 and a second drain electrode D2, wherein the second gate electrode G2 is electrically connected to the second scan line 110, and the second source electrode S2 is electrically connected to the data line 130. According to the present embodi-ment, the second thin-film transistor 122 has an orthogonal projection pattern on the XY plane, as shown in the enlarged diagram of part M2 in FIG. 1. According to the present embodiment, definition of said orthogonal projection pattern includes a pattern of the second source electrode S2, a pattern of the second drain electrode D2, the layout between the second source electrode S2 and the second drain electrode D2, and a pattern of the second channel CH2. Further, definition of the said orthogonal projection pattern does not include the structure, pattern and the layout design of the connecting wire between the second source electrode S2 and the data line 130, and the structure, pattern and the layout design of the connecting wire between the second drain electrode D2 and other components.

In the present embodiment, the second source electrode S2, for example, is connected by two conductor portions which are perpendicular to each other, wherein one conductor portion a2, for example, is an elongated conductor extended towards X direction, and another conductor portion a2, for example, is a elongated conductor extended towards Y direction. Moreover, the second drain electrode D2, for example, is composed by one conductor portion b, wherein the conductor portion b, for example, is an elongated conductor extended towards X direction. Specifically, the second drain electrode D2 is located within a right angular space defined by the second source electrode S2, and a right angular shape gap is located between the second drain electrode D2 and the second source electrode S2.

In view of above, the orthogonal projection pattern of the second thin-film transistor 122 on the XY plane and the orthogonal projection pattern of the first thin-film transistor 112 on the XY plane are substantially the same. Specifically, an orthogonal projection pattern of the first source electrode S1 on XY plane and an orthogonal projection pattern of the second source electrode S2 on XY plane are the same; an orthogonal projection pattern of the first drain electrode D1 on XY plane and an orthogonal projection pattern of the second drain electrode D2 on XY plane are the same; and an orthogonal projection pattern of the first channel CH1 on XY plane and an orthogonal projection pattern of the second channel CH2 on XY plane are the same. In other words, the patterns and shapes of the first source electrode S1 and the second source electrode S2 are the same observed in the same viewing direction, the patterns and shapes of the first drain electrode D1 and the second drain electrode D2 are the same, and the patterns and shapes of the first channel CH1 and the second channel CH2 are also the same.

In view of above, since the orthogonal projection pattern of the second thin-film transistor 122 on XY plane and the orthogonal projection pattern of the first thin-film transistor 112 on XY plane are substantially the same, deviations of patterns generated in each metal layer are the same if over-lapping alignment error of each metal layer occurs during the manufacturing process of the pixel unit 102a. In this case, the variation of gate/drain parasitic capacitance in the first thin-film transistor 112 and the variation of gate/drain parasitic capacitance in the second thin-film transistor 122 are the same. Since the variation of gate/drain parasitic capacitance in the first thin-film transistor 112 and the variation of gate/drain parasitic capacitance in the second thin-film transistor 122 remain the same, feed-through voltages of the first sub-pixel P1 and the second sub-pixel P2 are substantially the same, such that the display panel having the pixel array 100a may have a better display quality.

The second pixel electrode 124 is electrically connected to the second thin-film transistor 122. Specifically, the second pixel electrode 124 is electrically connected to the second drain electrode D2 through a contact window W2, and the second pixel electrode 124, for example, is driven by the second thin-film transistor 122.

Further, the pixel unit 102a of the present embodiment further includes a first capacitance electrode line 140 and a second capacitance electrode line 150, wherein the first capacitance electrode line 140 and the second capacitance electrode line 150, for example, are electrically connected to each other through the connecting line 160. The first capacitance electrode line 140, for example, is parallel with the first scan line 110. The first capacitance electrode line 140, for example, is formed simultaneously with the first scan line 110 and belonged to the same layer. The second capacitance electrode line 150, for example, is parallel with the second scan line 120. The second capacitance electrode line 150, for example, is formed simultaneously with the second scan line 120 and belonged to the same layer. The connecting line 160, for example, is parallel to the data line 130 and overlap with the data line 130.

In the present embodiment, the first capacitance electrode line 140 and the second capacitance electrode line 150, for example, are parallel with the first scan line 110 and the second scan line 120, and are manufactured using the same photomask process. However, in other embodiments, the first capacitance electrode line 140 and the second capacitance electrode line 150 may not be parallel with the first scan line 110 and the second scan line 120, and may be manufactured using different photomask processes, which is also possible, the invention is not limited thereto.

Further, the pixel units 102a of the present embodiment further includes a first capacitance electrode 116 and a second capacitance electrode 126. The first capacitance electrode 116 is electrically connected to the first thin-film transistor 112, and the second capacitance electrode 126 is electrically connected to the second thin-film transistor 122.

The first capacitance electrode 116, for example, is electrically connected to the first drain electrode D1 of the first thin-film transistor 112 through a connecting wire (not illustrated). The first capacitance electrode 116 is located on the first capacitance electrode line 140 so as to form a first capacitor C1.

The second capacitance electrode 126, for example, is electrically connected to the second drain electrode D2 of the second thin-film transistor 122 through a connecting wire (not illustrated). The second capacitance electrode 126 is located on the second capacitance electrode line 150 so as to form a second capacitor C2.

According to the present embodiment, an orthogonal projection pattern of the first capacitance electrode 116 on the XY plane and an orthogonal projection pattern of the second capacitance electrode 126 on the XY plane are substantially the same. Further, an area of the first capacitance electrode 116 and an area of the second capacitance electrode 126 are substantially the same, and a perimeter of the first capacitance electrode 116 and a perimeter of the second capacitance electrode 126 are substantially the same. Herein, definition of said orthogonal projection pattern includes the orthogonal projection pattern of the capacitance electrode itself, but does not include the orthogonal projection pattern of the connecting wire used for electrically connecting the thin-film transistor. The definition of said area includes an area of the capacitance electrode itself, but does not include an area of the connecting wire used for electrically connecting the thin-film transistor. Further, definition of said perimeter includes a perimeter of the capacitance electrode itself, but does not include a perimeter of connecting wire used for electrically connecting the thin-film transistor.

Generally, the area of the first capacitor C1 and the area of the second capacitor C2 are the same size, so that the first storage capacitance and the second storage capacitance may be the same. However, during the manufacturing process of the first capacitance electrode 116 and the second capacitance electrode 126, areas of the first capacitor C1 and the second capacitor C2 may be anisotropic reduced or enlarged due to deviation in a critical dimension (CD) bias of the line widths of the first capacitance electrode 116 and the second capacitance electrode 126, so that areas of the first capacitor C1 and the second capacitor C2 may be different, such that the first storage capacitance and the second storage capacitance may be different, and thereby feed-through voltage $V_f$ of the first sub-pixel P1 may be different from feed-through voltage of the second sub-pixel P2.

In view of above, since the area and perimeter of the first capacitance electrode 116 and the area and perimeter of the second capacitance electrode 126 are substantially the same, the areas of the capacitor C1 and the second capacitor C2 may be reduced or enlarged together (that is, having the same area variation) due to deviation in a CD bias of the line widths of first capacitance electrode 116 and the second capacitance electrode 126. As a result, since the variation of the first storage capacitance and the variation of the second storage capacitance are the same, allowing the first storage capacitance and the second storage capacitance to remain the same, such that feed-through voltage of the first sub-pixel P1 and feed-through voltage of the second sub-pixel may remain the same, thereby allowing the display panel having pixel array 100a to have a better display quality.

Second Embodiment

Figure 2:
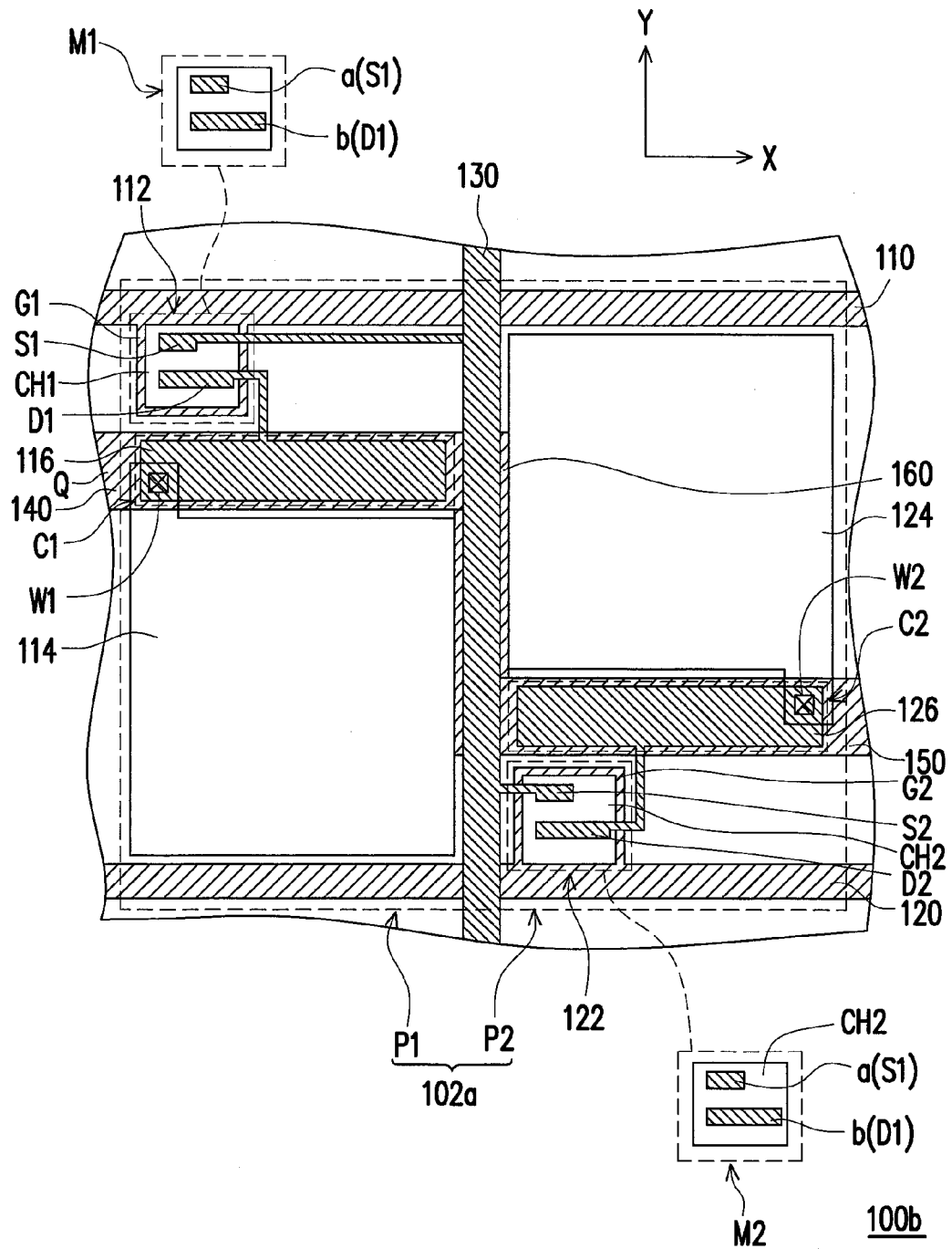
FIG. 2 is a partial view of a pixel array according to a second embodiment of the invention.

FIG. 2 is a partial view of a pixel array according to the second embodiment of the invention. Referring to FIG. 2, the pixel array 100b of the present embodiment is similar to the pixel array 100a of the first embodiment, their difference lies where the layout design of the thin-film transistor of the pixel array 100b is different from the layout design of the thin-film transistor of the pixel array 100a. It is noted that, components with same reference numerals represent same or similar components in the following embodiment, and the description to the same are omitted accordingly. The layout designs of the first thin-film transistor 112 and the second thin-film transistor 122 of the pixel array 100b are described in detail as below.

Referring to the enlarged diagram of part M1 in FIG. 2, the first source electrode S1 of the first thin-film transistor 112 of the present embodiment, for example, is composed by one conductor portion a, wherein the conductor portion a, for example, is an elongated conductor extended towards X direction. Moreover, the first drain electrode D1, for example, is composed by one conductor portion b, wherein the conductor portion b, for example, is an elongated conductor extended towards X direction. Specifically, the first source electrode S1 is arranged parallel with the first drain electrode D1, and the length of the first drain electrode D1 in the X direction is larger than the length of the first source electrode S1 in the X direction, and an elongated gap is located between the first drain electrode D1 and the first source electrode S1.

Referring to the enlarged diagram of part M2 in FIG. 2, the pattern and shape of the second thin-film transistor 122 and the pattern and shape of the first thin-film transistor 122 are substantially the same. Therefore, the orthogonal projection pattern of the first thin-film transistor 112 on the XY plane and the orthogonal projection pattern of the second thin-film transistor 122 on the XY plane are substantially the same.

Further, according to the present embodiment, the orthogonal projection pattern of the first capacitance electrode 116 on the XY plane and the orthogonal projection pattern of the second capacitance electrode 126 on the XY plane are substantially the same.

Third Embodiment

Figure 3:
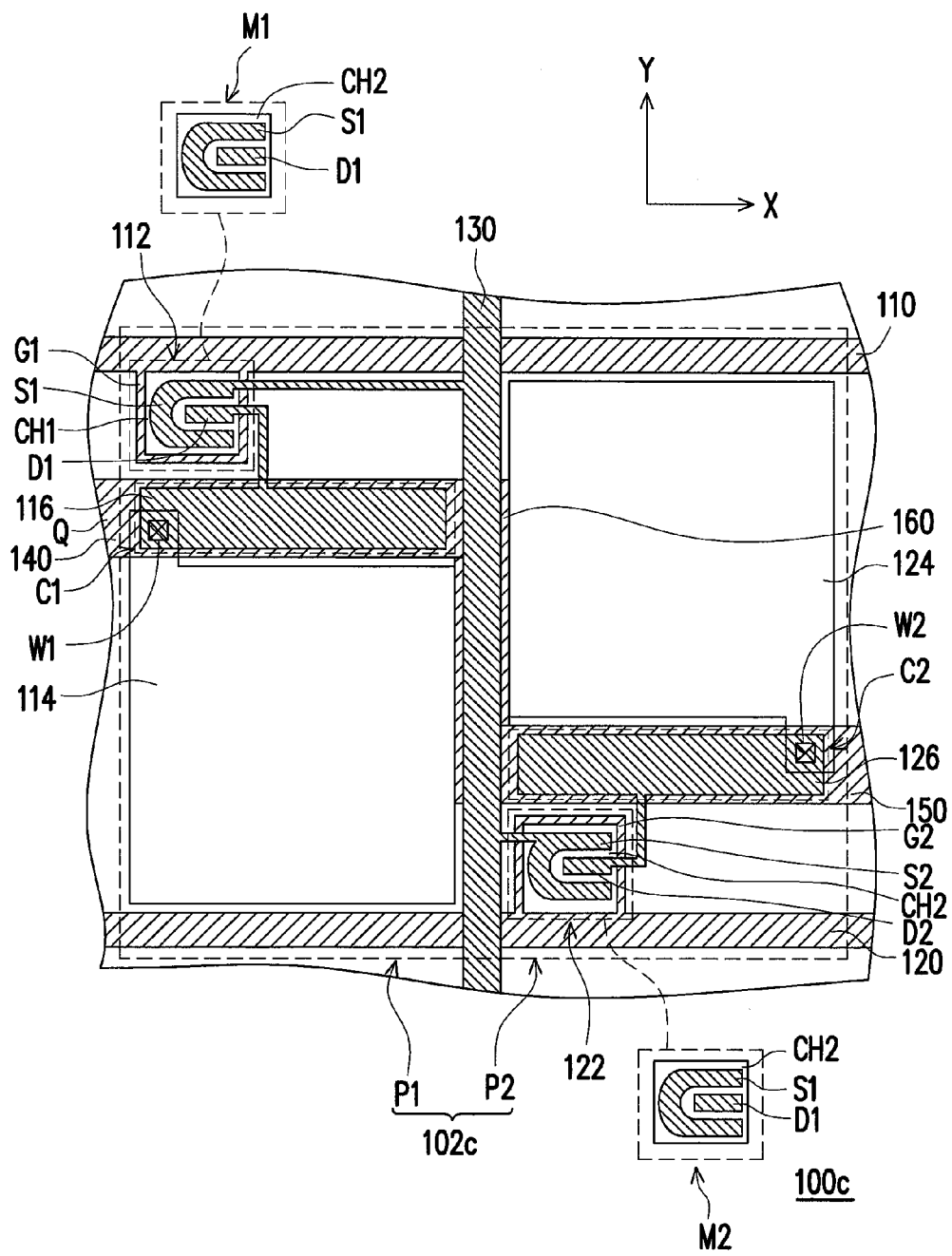
FIG. 3 is a partial view of a pixel array according to a third embodiment of the invention.

FIG. 3 is a partial view of a pixel array according to the third embodiment of the invention. Referring to FIG. 3, the pixel array 100c of the present embodiment is similar to the pixel array 100a of the first embodiment, their difference lies where the layout design of the thin-film transistor of the pixel array 100c is different from the layout design of the thin-film transistor of the pixel array 100a. The layout designs of the first thin-film transistor 112 and the second thin-film transistor 122 of the pixel array 100c are described in detail as below.

Referring to the enlarged diagram of part M1 in FIG. 3, the first source electrode S1 of the first thin-film transistor 112 of the present embodiment, for example, is composed by one conductor portion a, wherein the conductor portion a is a U-shaped conductor having an opening towards X direction. Moreover, the first drain electrode D1, for example, is composed by one conductor portion b, wherein the conductor portion b, for example, is an elongated conductor extended towards X direction. Specifically, the first drain electrode D1 is located within the opening of the first source electrode S1, and a U-shaped gap having an opening towards X direction is located between the first drain electrode D1 and the first source electrode S1.

Referring to the enlarged diagram of part M2 in FIG. 3, the pattern and shape of the second thin-film transistor 122 and the pattern and shape of the first thin-film transistor 122 are substantially the same. Therefore, the orthogonal projection pattern of the first thin-film transistor 112 on XY plane and the orthogonal projection pattern of the second thin-film transistor 122 on XY plane are substantially the same.

Further, according to the present embodiment, the orthogonal projection pattern of the first capacitance electrode 116 on XY plane and the orthogonal projection pattern of the second capacitance electrode 126 on XY plane are substantially the same.

It is worth mentioning that, the patterns of the thin-film transistors as described in the first embodiment, the second embodiment and the third embodiment are illustrative examples only, the invention is not limited thereto. As long as the orthogonal projection pattern of the first thin-film transistor on XY plane and the orthogonal projection pattern of the second thin-film transistor on XY plane are substantially the same in the same pixel unit, such pixel unit falls in the protection range which the invention intends to claim.

Display Panel

Figure 4:
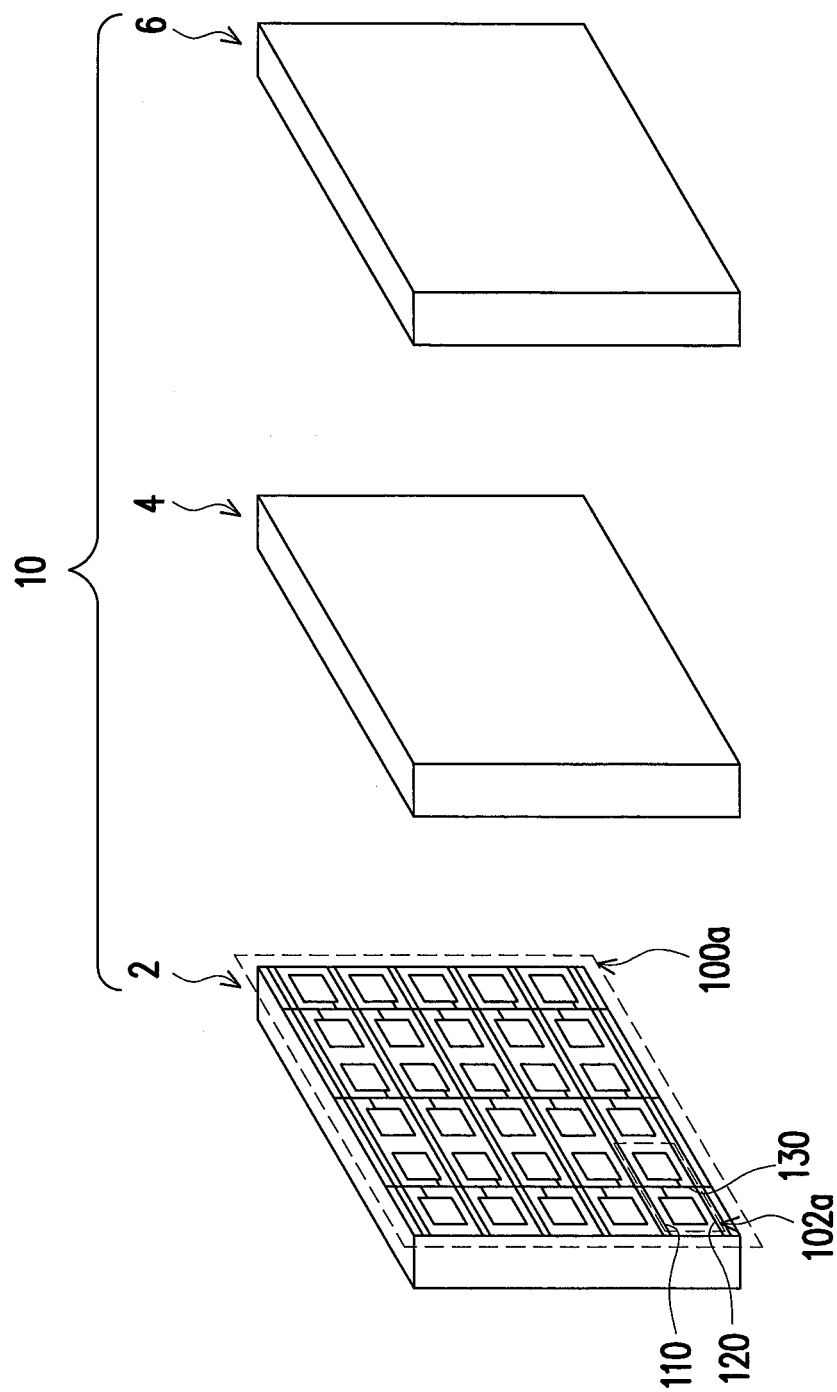
FIG. 4 is a 3D exploded view of a display panel according to an embodiment of the invention.

FIG. 4 is a 3D exploded view of a display panel according to an embodiment of the invention. Referring to FIG. 4, the display panel 10 of the present embodiment includes a first substrate 2, a second substrate 4 and a display medium 6. The second substrate 4 is located at the opposite side of the first substrate 2. The display medium 6 is located between the first substrate 2 and the second substrate 4. The second substrate 2 has a pixel array 100a. The pixel array 100a includes a plurality of pixel units 102a.

The second substrate 4, for example, is a color filter substrate. Generally, the color filter substrate includes a substrate, a color filter layer, a protection layer and a common electrode (not illustrated).

The display medium 6, for example, is a liquid crystal layer. During the operation of the display panel 10, an electric field is formed between the pixel electrode (not illustrated) on the first substrate 2 and the common electrode (not illustrated) on the second substrate 4, said electric field may be used for driving the liquid crystal molecules within the liquid crystal layer, such that the desired image may be displayed on the display panel 10.

Referring to both FIG. 1 and FIG. 4, the display panel 10 of the present embodiment includes said pixel array 100a, the pixel array 100a includes a plurality of pixel units 102a. The pixel unit 102a includes a first sub-pixel P1 and a second sub-pixel P2, wherein the first sub-pixel P1 includes a first scan line 110, a data line 130, a first thin-film transistor 112, and a first pixel electrode 114. The second sub-pixel P2 includes a second scan line 120, the data line 130, a second thin-film transistor 122 and a second pixel electrode 124. The orthogonal projection pattern of the first thin-film transistor 112 on the XY plane and the orthogonal projection pattern of the second thin-film transistor 122 on the XY plane are substantially the same. In view of above, since the display panel 10 includes the pixel array 100a, and feed-through voltages of the first sub-pixel P1 and the second sub-pixel P2 in the pixel unit 102a are the same. Therefore, during the operation of the display panel 10, the desired image may be displayed on the display panel 10 with excellent display quality and without any flickering. For detail description of the pixel array 100a, please refer back to the first embodiment above, it will not be described again hereinafter.

Further, the pixel array 100a is selected as to describe the display panel 10 of the present embodiment. However, the invention is not limited thereto. In other embodiments which are not illustrated herein, the pixel array 100b or the pixel array 100c may also be selected as the pixel array used on the second substrate 2 of the display panel 10.

Assessment to the Display Panels

Hereinafter, feed-through voltage is represented by $V_f$. Feed-through voltage is represented by the following formula:

$$V_f = [C_{gd}/(C_{lc}+C_{st}+C_{gd})] \times \Delta V_g \tag{1}$$

In formula (1), $C_{lc}$ represents the liquid crystal capacitance, $C_{st}$ represents the pixel storage capacitance, $\Delta V_g$ represents the scan lines voltage difference between on and off states of the thin-film transistor. $C_{gd}$ is the parasitic capacitance between the gate electrode and the drain electrode of the thin-film transistor, the channel has an electric conductance property when the scan line turns on the thin-film transistor. Therefore, $C_{gd}$ may be affected by the overlapping area between the channel and the gate electrode. In view of above, the thin-film transistors and the capacitors with the same or different pattern design are respectively used in the display panels of the following comparison examples and examples. Table 1 is a comparison of pattern designs of the first thin-film transistor and the second thin-film transistor of the display panel, and pattern designs of the first capacitance electrode and the second capacitance electrode of the display panels in comparison example 1, comparison example 2, example 1 and example 2.

The device performance of the display panel of the invention is described using testing result of, the deviation of the gate/drain parasitic capacitances ($\Delta C_{gd}$) between the first sub-pixel and the second sub-pixel, the deviation of storage capacitances ($\Delta C_{st}$) between the first sub-pixel and the second sub-pixel and the deviation of feed-through voltages ($\Delta V_f$) of the first sub-pixel and the second sub-pixel. Table 2 is the result of assessment to the display panels of comparison example 1, comparison example 2, example 1 and example 2.

TABLE 1

|  | Pattern designs of the first thin-film transistor and the second thin-film transistor | Pattern designs of the first capacitance electrode and the second capacitance electrode |
|---|---|---|
| Comparison example 1 | symmetrical in mirror | Same area |
| Comparison example 2 | symmetrical in mirror | Same pattern |
| Example 1 | Same pattern | Same area |
| Example 2 | Same pattern | Same pattern |

TABLE 2

|  | $\Delta C_{gd}(\%)$ | $\Delta C_{st}(\%)$ | $\Delta V_f(mV)$ |
|---|---|---|---|
| Comparison example 1 | 27 | 2 | 230 |
| Comparison example 2 | 27 | 0 | 210 |
| Example 1 | 0 | 2 | 20 |
| Example 2 | 0 | 0 | 0 |

In view of table 1 and table 2, it can be know that pattern designs of the first thin-film transistor and the second thin-film transistor of the display panel in comparison example 1 are symmetrical in mirror, and the pattern designs of the first capacitance electrode and the second capacitance electrode are only having the same area, in which the deviation of feed-through voltages between the first sub-pixel and the second sub-pixel is 230 mV. Generally, the voltages difference of one gray scale is approximately 20 mV. Accordingly, the voltages difference between the neighbouring sub-pixels of the display panel in comparison example 1 is approximately 11 gray scales.

Pattern designs of the first thin-film transistor and the second thin-film transistor of the display panel in comparison example 2 are symmetrical in mirror, and pattern designs of the first capacitance electrode and the second capacitance electrode are completely the same, in which the deviation of feed-through voltages between the first sub-pixel and the second sub-pixel is 210 mV. Therefore, the voltages difference between the neighbouring sub-pixels of the display panel in comparison example 2 is approximately 10 gray scales.

Pattern designs of the first thin-film transistor and the second thin-film transistor of the display panel in example 1 are completely the same, and pattern designs of the first capacitance electrode and the second capacitance electrode are only having the same area. Deviation of feed-through voltages between the first sub-pixel and the second sub-pixel of the display panel in example 1 is reduced to 20 mV. Therefore, the voltages difference between the neighbouring sub-pixels of the display panel in example 1 is improved to have only 1 gray scale difference, comparing to the display panels of comparison example 1 and comparison example 2. Accordingly, the same pattern designs of the first thin-film transistor and the second thin-film transistor may greatly reduce feed-through voltages difference between the neighbouring sub-pixels.

Further, pattern designs of the first thin-film transistor and the second thin-film transistor of the display panel in example 2 are completely the same, and pattern designs of the first capacitance electrode and the second capacitance electrode are completely the same, in which the deviation of feed-through voltages between the first sub-pixel and the second sub-pixel is 0 mV. Accordingly, the same pattern designs of the first thin-film transistor and the second thin-film transistor may further reduce feed-through voltages difference between the neighbouring sub-pixels, allowing the neighbouring sub-pixels to have substantially the same grey scale level, so that an excellent display quality may be obtained.

Base on the above, in the pixel unit of the pixel array of the invention, the orthogonal projection patterns of the first thin-film transistor and the second thin-film transistor on XY plane are substantially the same, and the orthogonal projection patterns of the first capacitance electrode and the second capacitance electrode on XY plane are substantially the same. Accordingly, since overlay shifts of the first thin-film transistor and the second thin-film transistor are the same, the variations of gate/drain capacitance in the first thin-film transistor and the second thin-film transistor may be the same if overlay shift occurs during manufacturing process of the pixel array. As a result, feed-through voltages of the neighbouring sub-pixels in the same pixel may remain the same, thereby allowing the display panel to have a better display quality.

Although the invention has been disclosed by the above embodiments, they are not intended to limit the invention. Those skilled in the art may make some modifications and alterations without departing from the spirit and scope of the invention. Therefore, the protection range of the invention falls in the appended claims.

What is claimed is:

1. A pixel array, comprising a plurality of pixel units, each of the plurality of pixel units comprising:
    a first scan line, a second scan line and a data line;
    a first thin-film transistor, electrically connect to the first scan line and the data line;
    a first pixel electrode, electrically connected to the first thin-film transistor;
    a second thin-film transistor, electrically connect to the second scan line and the data line;
    a second pixel electrode, electrically connected to the second thin-film transistor, wherein an orthogonal projection pattern, shape and orientation of the first thin-film transistor on a XY plane and that of the second thin-film transistor on the XY plane are together substantially the same as observed in a same viewing direction of the orthogonal projection pattern upon the XY plane;
    a first capacitance electrode line;
    a second capacitance electrode line;
    a first capacitance electrode electrically connected to the first thin-film transistor, wherein the first capacitance electrode is not overlapped with the data line and located on the first capacitance electrode line so as to form a first capacitor; and
    a second capacitance electrode electrically connected to the second thin-film transistor, wherein the second capacitance electrode is not overlapped with the data line and located on the second capacitance electrode line so as to form a second capacitor, wherein an area of the first capacitance electrode and an area of the second capacitance electrode are substantially the same, wherein a perimeter of the first capacitance electrode and a perimeter of the second capacitance electrode are substantially the same, an orthogonal projection pattern, shape and orientation of the first capacitance electrode on the XY plane and that of the second capacitance electrode on the XY plane are together substantially the same as observed in the same viewing direction of the orthogonal projection pattern upon the XY plane.

2. The pixel array of claim 1, wherein
    the first capacitor is electrically connected to the first thin-film transistor; and the second capacitor is electrically connected to the second thin-film transistor, wherein an area of the first capacitor and an area of the second capacitor are substantially the same.

3. The pixel array of claim 1, wherein a perimeter of the first capacitor and a perimeter of the second capacitor are substantially the same.

4. The pixel array of claim 1, wherein an orthogonal projection pattern of the first capacitor on the XY plane and an orthogonal projection pattern of the second capacitor on the XY plane are substantially the same.

5. The pixel array of claim 1, wherein:
the first thin-film transistor comprises a first gate electrode, a first channel, a first source electrode and a first drain electrode, the first gate electrode is electrically connected to the first scan line, and the first source electrode is electrically connected to the data line; and
the second thin-film transistor comprises a second gate electrode, a second channel, a second source electrode and a second drain electrode, the second gate electrode is electrically connected to the second scan line, and the second source electrode is electrically connected to the data line, wherein
an orthogonal projection pattern of the first channel on the XY plane and an orthogonal projection pattern of the second channel on the XY plane are substantially the same,
an orthogonal projection pattern of the first source electrode on the XY plane and an orthogonal projection pattern of the second source electrode on the XY plane are substantially the same, and
an orthogonal projection pattern of the first drain electrode on the XY plane and an orthogonal projection pattern of the second drain electrode on the XY plane are substantially the same.

6. The pixel array of claim 1, wherein the orthogonal projection pattern of the first thin-film transistor on the XY plane and the orthogonal projection pattern of the second thin-film transistor on the XY plane are not symmetrical in mirror.

7. A display panel, comprising:
a first substrate, including a pixel array as claimed in claim 1;
a second substrate, located at an opposite side of the first substrate; and
a display medium, located between the first substrate and the second substrate.

8. A pixel array, comprising a plurality of pixel units, each of the plurality of pixel units comprising:
a first scan line, a second scan line and a data line;
a first thin-film transistor, electrically connect to the first scan line and the data line, wherein the first thin-film transistor comprises:
a first gate electrode, electrically connected to the first scan line;
a first source electrode, electrically connected to the data line, and the first source electrode comprises a first source electrode conductor portion extended in a first direction;
a first drain electrode, which comprises a first drain electrode conductor portion extended in the first direction; and
a first channel located between the first gate and the first source;
a first pixel electrode, electrically connected to the first thin-film transistor;
a second thin-film transistor, electrically connect to the second scan line and the data line, wherein the first thin-film transistor and the second thin-film transistor are located at two opposite sides of the data line respectively, and wherein the second thin-film transistor comprises:
a second gate electrode, electrically connected to the second scan line, wherein an orthogonal projection pattern, shape and orientation of the second gate electrode on a XY plane and that of the first gate electrode on the XY plane are together substantially the same as observed in a same viewing direction of the orthogonal projection pattern upon the XY plane;
a second source electrode, electrically connected to the data line, and the second source electrode comprises a second source electrode conductor portion extended in the first direction, wherein an orthogonal projection pattern, shape and orientation of the second source electrode on the XY plane and that of the first source electrode on the XY plane are together substantially the same as observed in a same viewing direction of the orthogonal projection pattern upon the XY plane;
a second drain electrode, which comprises a second drain electrode conductor portion extended in the first direction, wherein an orthogonal projection pattern, shape and orientation of the second drain electrode on the XY plane and that of the first drain electrode on the XY plane are together substantially the same as observed in a same viewing direction of the orthogonal projection pattern upon the XY plane; and
a second channel located between the second gate and the second source;
a second pixel electrode, electrically connected to the second thin-film transistor;
a first capacitance electrode line;
a second capacitance electrode line;
a first capacitance electrode electrically connected to the first thin-film transistor, wherein the first capacitance electrode is not overlapped with the data line and located on the first capacitance electrode line so as to form a first capacitor; and
a second capacitance electrode electrically connected to the second thin-film transistor, wherein the second capacitance electrode is not overlapped with the data line and located on the second capacitance electrode line so as to form a second capacitor, wherein an area of the first capacitance electrode and an area of the second capacitance electrode are substantially the same, wherein a perimeter of the first capacitance electrode and a perimeter of the second capacitance electrode are substantially the same, an orthogonal projection pattern, shape and orientation of the first capacitance electrode on the XY plane and that of the second capacitance electrode on the XY plane are together substantially the same as observed in the same viewing direction of the orthogonal projection pattern upon the XY plane.

9. The pixel array of claim 8, wherein the first source electrode further comprises a third source electrode conductor portion extended in a second direction that is perpendicular to the first direction, and the third source electrode conductor portion is connected to the first source electrode conductor portion, and the second source electrode further comprises a fourth source electrode conductor portion extended in the second direction, and the fourth source electrode conductor portion is connected to the second source electrode conductor portion.

10. The pixel array of claim 8, wherein a length of the first drain electrode in the first direction is larger than a length of the first source electrode in the first direction.

11. The pixel array of claim 8, wherein the first source electrode is an U-shaped conductor having an opening towards the first direction.

12. The pixel array of claim 8, wherein
the first capacitor is electrically connected to the first thin-film transistor; and
the second capacitor is electrically connected to the second thin-film transistor, wherein an area of the first capacitor and an area of the second capacitor are substantially the same.

13. The pixel array of claim 8, wherein a perimeter of the first capacitor and a perimeter of the second capacitor are substantially the same.

14. The pixel array of claim 8, wherein an orthogonal projection pattern of the first capacitor on the XY plane and an orthogonal projection pattern of the second capacitor on the XY plane are substantially the same as observed in a same viewing direction of the orthogonal projection pattern upon the XY plane.

15. The pixel array of claim 8,
wherein the first capacitance electrode line and the second capacitance electrode line are electrically connected to each other through a connecting line which is parallel to the data line, overlapped with the data line and located between the first scan line and the second scan line.

16. A pixel array, comprising a plurality of pixel units, each of the plurality of pixel units comprising:
a first scan line, a second scan line and a data line;
a first thin-film transistor, electrically connect to the first scan line and the data line;
a first pixel electrode, electrically connected to the first thin-film transistor;
a second thin-film transistor, electrically connect to the second scan line and the data line;
a second pixel electrode, electrically connected to the second thin-film transistor, wherein an orthogonal projection pattern, shape and orientation of the first thin-film transistor on a XY plane and that of the second thin-film transistor on the XY plane are together substantially the same as observed in a same viewing direction of the orthogonal projection pattern upon the XY plane;
a first capacitance electrode line;
a second capacitance electrode line;
a first capacitance electrode electrically connected to the first thin-film transistor through a first connecting wire, wherein the first capacitance electrode is located on and overlapped with the first capacitance electrode line so as to form a first capacitor; and
a second capacitance electrode electrically connected to the second thin-film transistor through a second connecting wire, wherein the second capacitance electrode is located on and overlapped with the second capacitance electrode line so as to form a second capacitor, wherein an area of the first capacitance electrode and an area of the second capacitance electrode are substantially the same, wherein a perimeter of the first capacitance electrode and a perimeter of the second capacitance electrode are substantially the same, an orthogonal projection pattern, shape and orientation of the first capacitance electrode on the XY plane and that of the second capacitance electrode on the XY plane are together substantially the same as observed in the same viewing direction of the orthogonal projection pattern upon the XY plane, wherein the first pixel electrode is electrically connected with the first thin-film transistor sequentially through a first contact hole, the first capacitance electrode and the first connecting wire, and wherein the second pixel electrode is electrically connected with the second thin-film transistor sequentially through a second contact hole, the second capacitance electrode and the second connecting wire.

17. A pixel array, comprising a plurality of pixel units, each of the plurality of pixel units comprising:
a first scan line, a second scan line and a data line;
a first thin-film transistor, electrically connect to the first scan line and the data line;
a first pixel electrode, electrically connected to the first thin-film transistor;
a first capacitance electrode electrically connected to the first thin-film transistor,
a second thin-film transistor, electrically connect to the second scan line and the data line;
a second pixel electrode, electrically connected to the second thin-film transistor, wherein an orthogonal projection pattern, shape and orientation of the first thin-film transistor on a XY plane and that of the second thin-film transistor on the XY plane are together substantially the same as observed in a same viewing direction of the orthogonal projection pattern upon the XY plane; and
a second capacitance electrode electrically connected to the second thin-film transistor, wherein a perimeter of the first capacitance electrode and a perimeter of the second capacitance electrode are substantially the same, and an orthogonal projection pattern of the first capacitance electrode on the XY plane and an orthogonal projection pattern of the second capacitance electrode on the XY plane are substantially the same.

* * * * *